United States Patent
Choi

(10) Patent No.: US 9,497,396 B2
(45) Date of Patent: Nov. 15, 2016

(54) WDR PIXEL ARRAY, WDR IMAGING APPARATUS INCLUDING THE SAME AND METHOD FOR OPERATING THE SAME

(75) Inventor: Woon Il Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 185 days.

(21) Appl. No.: 14/111,607

(22) PCT Filed: Apr. 29, 2011

(86) PCT No.: PCT/KR2011/003229
§ 371 (c)(1),
(2), (4) Date: Mar. 4, 2014

(87) PCT Pub. No.: WO2012/141369
PCT Pub. Date: Oct. 18, 2012

(65) Prior Publication Data
US 2014/0211052 A1 Jul. 31, 2014

(30) Foreign Application Priority Data
Apr. 13, 2011 (KR) .......................... 10-2011-0034458

(51) Int. Cl.
*H04N 5/235* (2006.01)
*H04N 5/355* (2011.01)
*H01L 27/146* (2006.01)

(52) U.S. Cl.
CPC ...... *H04N 5/3559* (2013.01); *H01L 27/14609* (2013.01); *H04N 5/35572* (2013.01)

(58) Field of Classification Search
CPC .............. H04N 5/374; H04N 5/2354; H04N 5/35572; H04N 5/335; H04N 5/2355; H04N 5/2356; H04N 5/355; H04N 5/35581; H04N 3/1556; H04N 5/343; H04N 5/3765; H04N 5/3559; H01L 27/14609
See application file for complete search history.

(56) References Cited

U.S. PATENT DOCUMENTS

| | | | |
|---|---|---|---|
| 6,002,123 A | * | 12/1999 | Suzuki ........................ 250/208.1 |
| 7,872,286 B2 | * | 1/2011 | Okita et al. ................... 257/291 |
| 7,965,328 B2 | * | 6/2011 | Wakamori ............. H04N 5/374 348/308 |

(Continued)

FOREIGN PATENT DOCUMENTS

| | | |
|---|---|---|
| JP | 2006-197382 A | 7/2006 |
| JP | 2010-206719 A | 9/2010 |

(Continued)

OTHER PUBLICATIONS

International Search Report in International Application No. PCT/KR2011/003229, filed Apr. 29, 2011.

(Continued)

*Primary Examiner* — Aung S Moe
(74) *Attorney, Agent, or Firm* — Saliwanchik, Lloyd & Eisenschenk

(57) ABSTRACT

Disclosed is a WDR pixel array having high sensitivity under the middle intensity of illumination and high intensity of illumination by using the 4T pixel structure representing high sensitivity under the low intensity of illumination. According to the embodiment, the overflow charges generated under the very high intensity of illumination are not discarded or partially stored, but read through the 3T pixel operation, so that the WDR pixel array having high sensitivity under the middle intensity of illumination and high intensity of illumination can be obtained based on the 4T pixel structure without additionally providing a transistor or a photodiode for the high intensity of illumination in the WDR pixel array.

15 Claims, 5 Drawing Sheets

(56) References Cited

U.S. PATENT DOCUMENTS

| | | | |
|---|---|---|---|
| 8,179,459 B2* | 5/2012 | Koizumi | 348/294 |
| 8,324,550 B2* | 12/2012 | Lyu | 250/208.1 |
| 2004/0096124 A1* | 5/2004 | Nakamura | 382/308 |
| 2006/0102827 A1* | 5/2006 | Kasuga et al. | 250/208.1 |
| 2006/0157759 A1 | 7/2006 | Okita et al. | |
| 2006/0158539 A1* | 7/2006 | Koizumi et al. | 348/300 |
| 2006/0208291 A1* | 9/2006 | Koizumi et al. | 257/292 |
| 2006/0221667 A1* | 10/2006 | Ogura et al. | 365/149 |
| 2008/0084489 A1* | 4/2008 | Kishi | H04N 5/37457 348/308 |
| 2008/0239126 A1* | 10/2008 | Wakamori | 348/308 |
| 2008/0252742 A1* | 10/2008 | Oike | 348/222.1 |
| 2009/0002528 A1* | 1/2009 | Manabe et al. | 348/248 |
| 2009/0045319 A1* | 2/2009 | Sugawa | H01L 27/14609 250/208.1 |
| 2009/0101796 A1* | 4/2009 | Ladd et al. | 250/206 |
| 2009/0244345 A1* | 10/2009 | Song | H04N 5/3745 348/308 |
| 2010/0097508 A1* | 4/2010 | Yanagita et al. | 348/301 |
| 2010/0128156 A1* | 5/2010 | Tanaka | H04N 5/378 348/308 |
| 2010/0188541 A1* | 7/2010 | Mabuchi et al. | 348/302 |
| 2010/0208115 A1* | 8/2010 | Sugawa | H04N 5/35527 348/308 |
| 2011/0085066 A1* | 4/2011 | Sugawa et al. | 348/302 |
| 2012/0001082 A1* | 1/2012 | Shoho et al. | 250/369 |
| 2012/0002089 A1* | 1/2012 | Wang et al. | 348/297 |
| 2012/0068051 A1* | 3/2012 | Ahn et al. | 250/208.1 |

FOREIGN PATENT DOCUMENTS

| | | |
|---|---|---|
| KR | 10-0800307 B1 | 2/2008 |
| KR | 10-2008-0092862 A | 10/2008 |
| TW | 2010-04334 A | 1/2010 |

OTHER PUBLICATIONS

Notice of Allowance dated Feb. 18, 2013 in Korean Application No. 10-2011-0034458, filed Apr. 13, 2011.

Office Action dated Apr. 8, 2014 in Taiwanese Application No. 100115215.

* cited by examiner (a) low intensity of illumination (b) middle intensity of illumination (c) high intensity of illumination (d) very high intensity of illumination

WDR PIXEL ARRAY, WDR IMAGING APPARATUS INCLUDING THE SAME AND METHOD FOR OPERATING THE SAME

CROSS-REFERENCE TO RELATED APPLICATIONS

This application is the U.S. national stage application of International Patent Application No. PCT/KR2011/003229, filed Apr. 29, 2011, which claims priority to Korean Application No. 10-2011-0034458, filed Apr. 13, 2011, the disclosures of each of which are incorporated herein by reference in their entirety.

TECHNICAL FIELD

The embodiment relates to a WDR (wide dynamic range) pixel array, an imaging apparatus including the same and a method for operating the same. More particularly, the embodiment provides a WDR pixel array having high sensitivity under the middle intensity of illumination and high intensity of illumination by using the 4T pixel structure representing high sensitivity under the low intensity of illumination. According to the embodiment, the overflow charges generated under the very high intensity of illumination are not discarded or partially stored, but read through the 3T pixel operation, so that the WDR pixel array having high sensitivity under the middle intensity of illumination and high intensity of illumination can be obtained based on the 4T pixel structure without additionally providing a transistor or a photodiode for the high intensity of illumination in the WDR pixel array.

BACKGROUND ART

A dynamic range is one of important factors to determine the quality of an image sensor. In general, the dynamic range refers to the maximum range for processing signals without distorting input signals. In the case of the image sensor, images having the superior quality can be obtained as the dynamic range becomes widened regardless of the brightness variation.

However, according to the color image sensor of the related art, the dynamic range is so narrow that the original color of the image may not be expressed well when one of red, green and blue colors is saturated. In order to solve the problem caused by the narrow dynamic range, a WDR (wide dynamic range) pixel has been suggested.

First, there has been suggested a method of realizing the WDR operation by adjusting irradiation time of the light in the image sensor of the related art.

Second, there has been suggested a method of providing an additional capacitor to change FD (floating diffusion) capacity, in which a pixel structure includes a transistor to adjust the additional capacitor so that overflow charges, which are generated from a PD (photodiode) under the high intensity of illumination as light intensity is increased, can be stored in the additional capacitor.

Third, there has been suggested a method of providing a WDR pixel, in which two PDs are installed in one pixel such that charges generated from the two PDs are combined with each other.

However, according to the first method, the sensitivity is constant regardless of the variation of light intensity (that is, high intensity of illumination and low intensity of illumination), so that the image may be darkened under the low intensity of illumination. In addition, while the pixel is being operated, the timing adjustment for the pixel operation under the high intensity of illumination may be limited.

DISCLOSURE OF INVENTION

Technical Problem

The embodiment provides a WDR pixel array having high sensitivity under the middle intensity of illumination and high intensity of illumination by using the 4T pixel structure representing high sensitivity under the low intensity of illumination, and a method for operating the WDR pixel array.

Solution to Problem

A method for operating a pixel according to the embodiment includes the steps of starting an integration process for a photo-electro conversion unit; reading an overflow signal level of the photo-electro conversion unit; draining optical charges stored in a storage region by applying a reset signal to a reset switching unit; reading a reset signal level; transferring the stored optical charges from the photo-electro conversion unit to the storage region by turning on a transfer switching unit; and reading a signal level of the optical charges transferred to the storage region.

An imaging apparatus according to the embodiment includes a photo-electro conversion unit on a substrate; a transfer switching unit on the substrate at one side of the photo-electro conversion unit; a storage region on the substrate at one side of the transfer switching unit; a plurality of pixels including a reset switching unit on the substrate at ones side of the storage region; and a control circuit reading a signal level and a reset signal level and applying a signal to the transfer switching unit and the reset switching unit. The control circuit reads an overflow signal level of the photo-electro conversion unit, applies a reset signal to the reset switching unit to drain optical charges stored in the storage region, reads the reset signal level, turns on the transfer switching unit to transfer the stored optical charges from the photo-electro conversion unit to the storage region, and reads the signal level of the optical charges transferred to the storage region.

Advantageous Effects of Invention

According to the embodiment, the overflow charges generated under the very high intensity of illumination are not discarded or partially stored, but read through the 3T pixel operation, so that the WDR pixel array having high sensitivity under the middle intensity of illumination and high intensity of illumination can be obtained based on the 4T pixel structure without additionally providing a transistor or a photodiode for the high intensity of illumination in the WDR pixel array.

MODE FOR THE INVENTION

Hereinafter, the embodiments will be described in detail with reference to the accompanying drawings.

Figure 1:
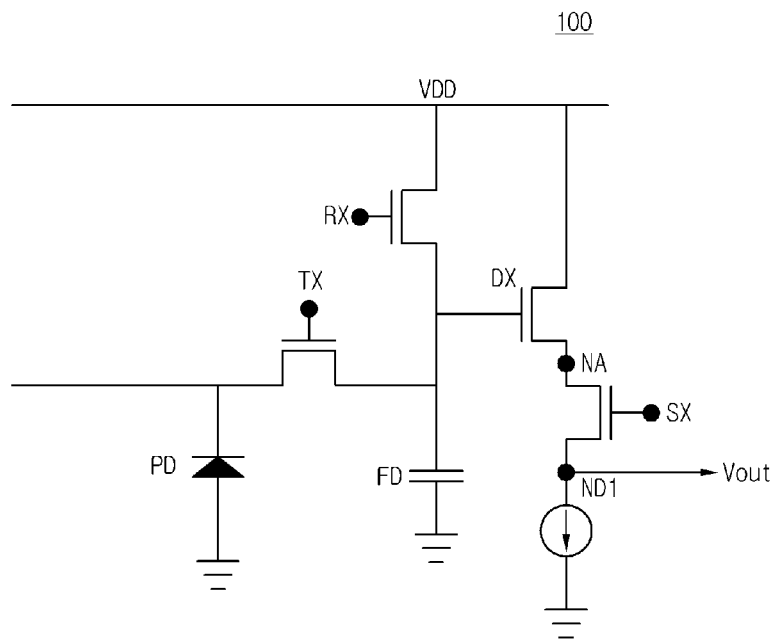
FIG. 1 is a circuit view of a WDR pixel according to one embodiment.

FIG. 1 is a circuit view of a WDR pixel 100 according to one embodiment.

As shown in FIG. 1, the WDR pixel 100 of the embodiment includes a photodiode PD, a transfer transistor TX, a floating diffusion node FD, a reset transistor RX provided at one side of the transfer transistor TX, a drive transistor DX and a select transistor SX.

The photodiode PD is an example of a photo-electro conversion unit according to the embodiment and receives photo energy to generate and store photo charges.

The transfer transistor TX an example of a transfer switching unit according to the embodiment and transfers the charges (or optical current) stored in the photodiode PD to the floating diffusion node FD in response to a control signal input into a gate.

The floating diffusion node FD is an example of a storage region according to the embodiment and receives the charges generated from the photodiode PD through the transfer transistor TX to store the charges therein.

The reset transistor RX is an example of a reset switching unit according to the embodiment and is connected between a power supply VDD and the floating diffusion node FD to drain the charges stored in the floating diffusion node FD to the power supply VDD in response to a rest signal RST.

The drive transistor DX (or source follower transistor) is an example of a drive switching unit according to the embodiment and is connected between the power supply VDD and a first node NA to source-follow the first node NA to the power supply VDD based on the charges stored in the floating diffusion node FD.

The select transistor SX is an example of a select switching unit according to the embodiment and is connected to the first node NA and an output node ND1 to form an electric route for the first node NA and the output node ND1 in response to a select signal SEL.

Figure 2:
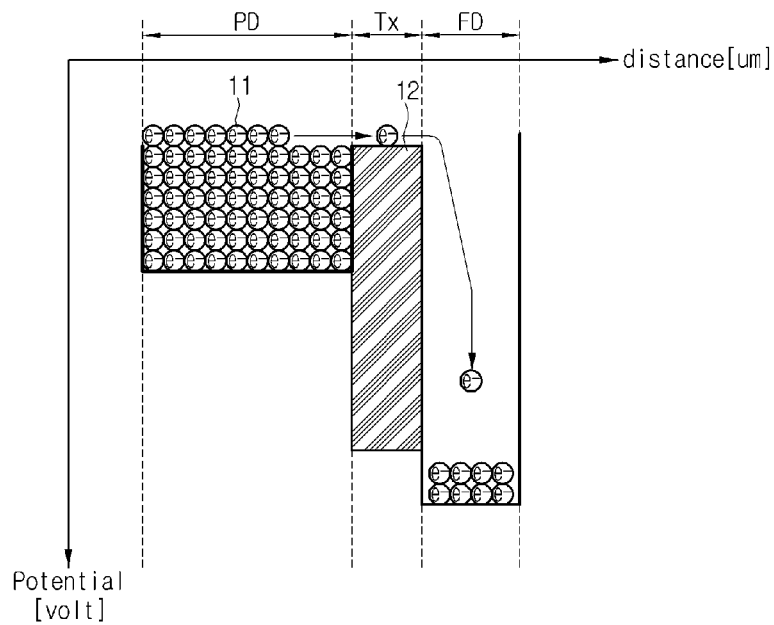
FIG. 2 is a schematic view for explaining the operation of a photodiode PD, a transfer transistor TX and a floating diffusion node FD.

FIG. 2 is a schematic view for explaining the operation of the photodiode PD, the transfer transistor TX and the floating diffusion node FD.

The photodiode PD receives the light to store charges 11 (electrons or holes) therein. The photodiode PD accumulates the charges 11 until the transfer transistor TX is turned on. However, as shown in FIG. 2, if the light exceeding the maximum capacity of the photodiode PD is received in the photodiode PD, the charges may overflow a channel potential barrier 12 of the transfer transistor TX kept in the turn-off state. This phenomenon is called "blooming". One of important functions of the transfer transistor TX is an anti-blooming function for preventing the charges from spreading to photodiodes of other pixels by overflowing the channel potential barrier 12 of the transfer transistor TX kept in the turn-off state. The intensity of overflow charges may not be read, and this limits the dynamic range under the high intensity of illumination in the related art.

However, according to the embodiment, the dynamic range can be expanded by reading the overflow charges. Different from the related art, the overflow charges are not drained, but collected to read the signal level of the overflow charges, so that the light having the high intensity of illumination can be read. Thus, according to the embodiment, the wide dynamic range can be realized by reading the overflow charges.

Figure 3:
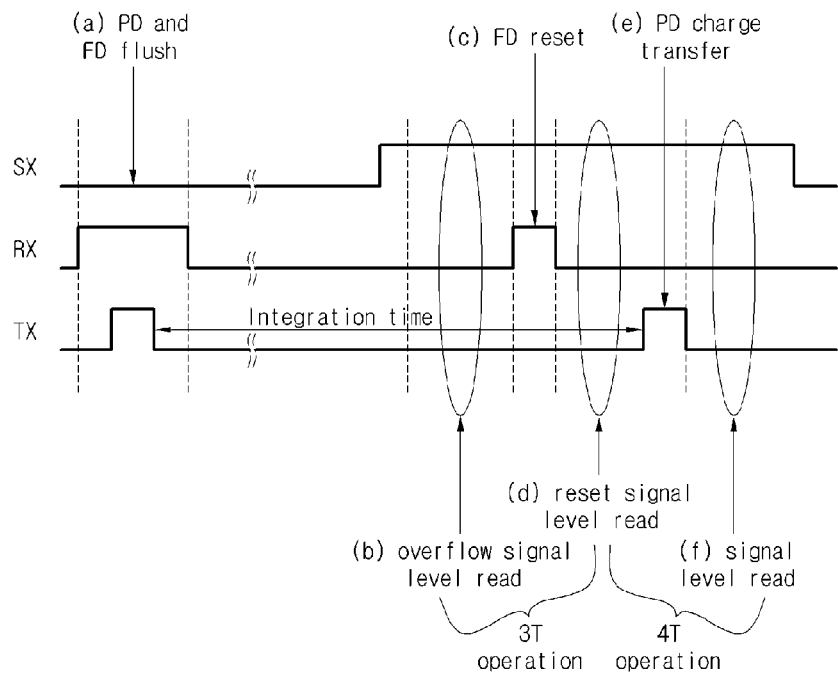
FIG. 3 is a timing diagram showing the switching operation of switching devices of a pixel according to the embodiment.
Figure 4:
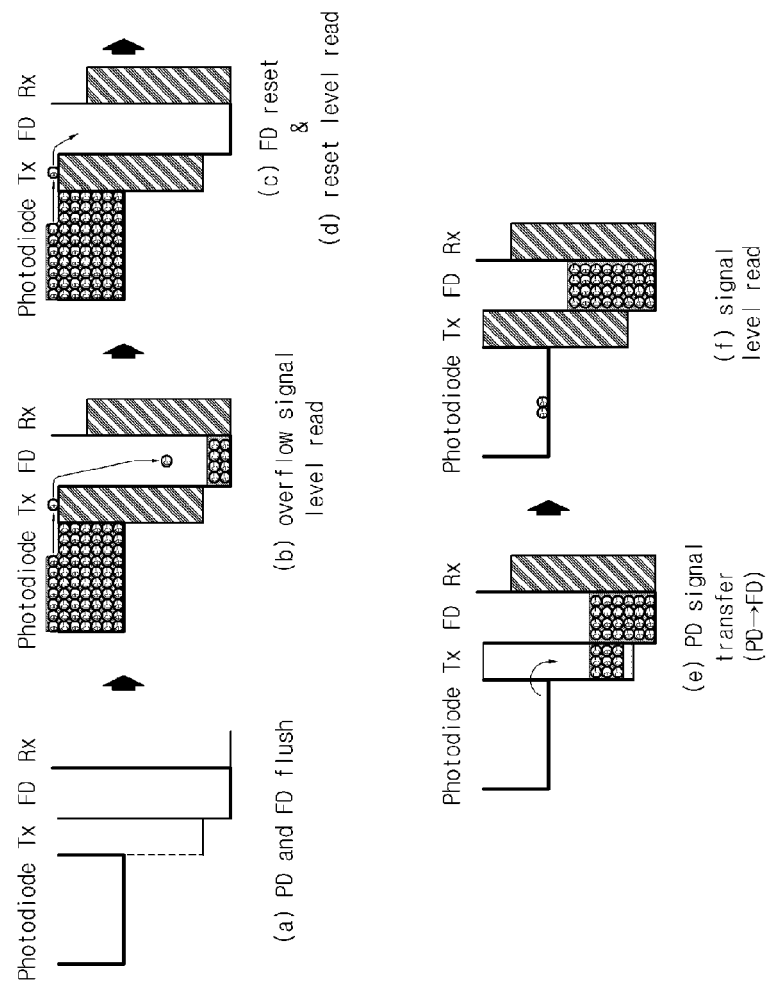
FIG. 4 is a schematic view showing the potential profile of PD, TX, FD and RX corresponding to the switching operation shown in FIG. 3.

FIG. 3 is a timing diagram showing the switching operation of the transfer transistor, the reset transistor RX, and the select transistor SX according to the embodiment, and FIG. 4 is a schematic view showing the potential profile of the photodiode PD, the transfer transistor TX, the floating diffusion node FD and the reset transistor RX corresponding to the switching operation shown in FIG. 3.

Figure 5:
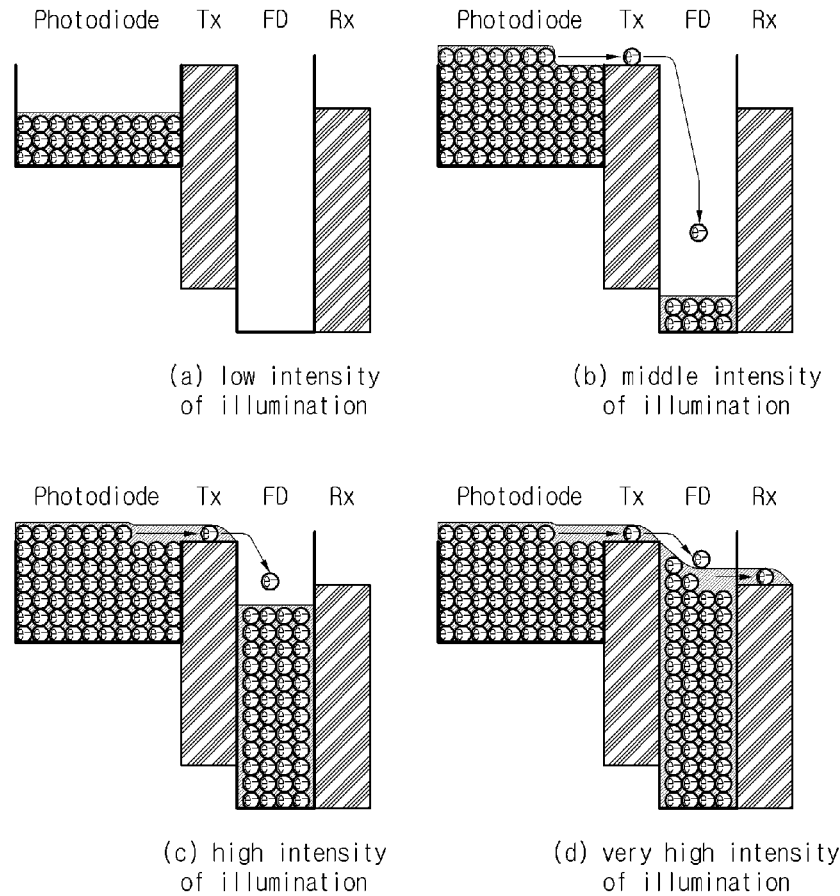
FIG. 5 is a schematic view showing quantity of charges generated under the low intensity, middle intensity, high intensity and very high intensity of illumination.

Referring to FIGS. 3 and 4, in the PD flush step (a), the transfer transistor TX and the reset transistor RX are turned on so that all charges remaining in the photodiode PD and the floating diffusion node FD are drained. Then, the transfer transistor TX and the reset transistor RX are turned off to perform the charge integration process. During the charge integration process, the overflow charges may be generated and there is variation in the quantity of the overflow charges depending on the light intensity, such as the low intensity, middle intensity, high intensity and very high intensity of illumination. FIG. 4(b) represents the middle intensity of illumination and FIG. 5 represents the low intensity, middle intensity, high intensity and very high intensity of illumination.

In the overflow signal level reading step (b), the level of the overflow signal transferred from the photodiode PD to the floating diffusion node FD is read. In the typical 4T pixel operation, that is, when four transistors TX, RX, SX and DX are used, the charges accumulated in the floating diffusion node FD is drained to the power supply VDD before the reset signal level of the floating diffusion node FD is read. However, according to the embodiment, the overflow charges transferred from the photodiode PD to the floating diffusion node FD are not drained, but read through the typical 3T pixel operation, in which the transfer transistor TX is not used. Different from the 3T pixel operation of the related art, according to the embodiment, the signal level of the overflow charges transferred to the floating diffusion node FD from the photodiode PD is read without reading the signal level of the charges accumulated in the photodiode PD.

Meanwhile, in order to read the signal level of the overflow charges, the select switching unit SX is turned on earlier than the related art. In detail, the select switching unit SX is turned on before the reset transistor RX is turned on to read the FD reset signal level.

In the FD reset step (c), the reset transistor RX is turned on to drain all charges of the floating diffusion node FD. In the reset signal level reading step (d), the FD reset signal level is read.

In the PD signal transfer step (e), the transfer transistor TX is turned on to transfer the charges accumulated in the photodiode PD to the floating diffusion node FD and then the transfer transistor TX is turned off. In the signal level reading step (f), the FD signal level is read.

Steps (b), (c) and (d) correspond to the 3T pixel operation, and steps (d), (e) and (f) correspond to the 4T pixel operation. Since the 3T pixel operation and the 4T pixel operation are performed in one pixel, the above operation may be referred to as a hybrid pixel operation scheme.

In the above operation, the signal levels are read three times, in which the signal difference between the overflow signal level and the reset signal level becomes the actual overflow signal level and the signal difference between the reset signal level and the PD signal level becomes the actual PD signal level.

Figure 6:
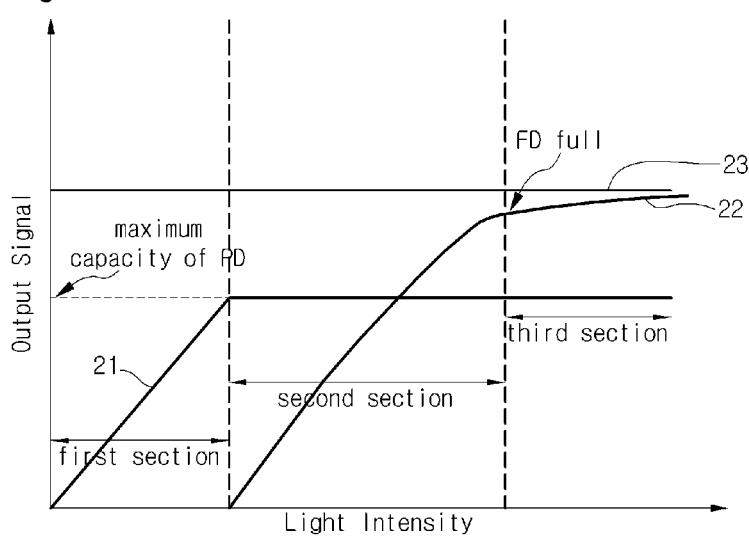
FIG. 6 is a graph showing an output signal as a function of the light intensity of a pixel array according to one embodiment in the 4T operation section and the 3T operation section.

FIG. 6 is a graph showing an output signal as a function of the light intensity of the pixel array according to one embodiment in the 4T operation section and the 3T operation section.

The first section shown in FIG. 6 is subject to the low intensity of illumination or the normal intensity of illumination where the overflow charges are not generated from the photodiode PD, so the general 4T operation is performed. At this time, a linear signal level 21 is detected until it reaches the maximum capacity of the photodiode PD. The 3T operation is performed in the second and third sections, in which a signal level 22 represents the linear characteristic in the early stage and then represents the log characteristic converged to the asymptotic line 23 after the reset transistor RX has been turned on. In detail, the overflow charges start to generate from the photodiode PD in the second section. According to the embodiment, as described above, the overflow charges generated from the photodiode PD are not discarded, but the signal level of the overflow charges is read. The third section starts after the overflow charges have been fully filled in the storage region and represents the sub-threshold behavior before the reset transistor RX is turned on. Thus, the output signal is very slowly increased in the vicinity of the turn-on of the reset transistor RX and represents the log characteristic converged to the asymptotic line 23. In other words, even if the light having the high intensity is incident, the output signal is converged to the asymptotic line 23 due to the sub-threshold behavior of the reset transistor RX without exceeding the maximum capacity of the photo-electro conversion unit (that is, the photodiode PD), so the dynamic range can be expanded as wide as possible.

Figure 7:
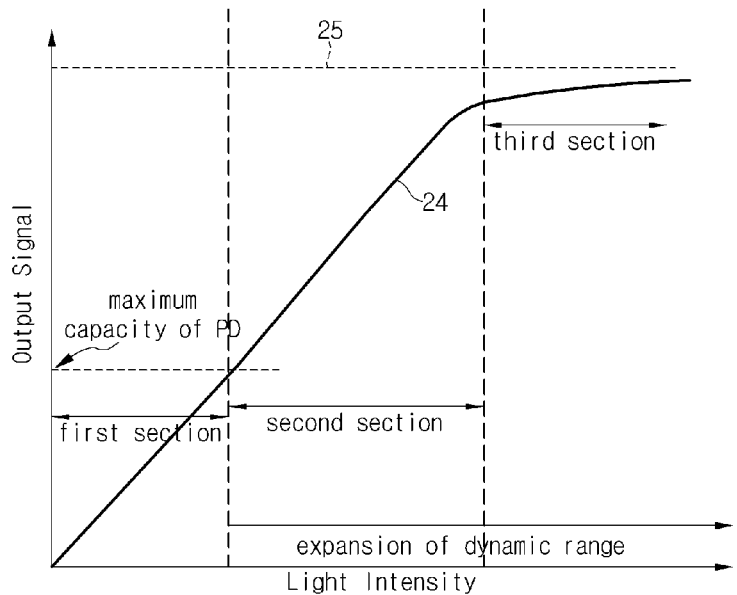
FIG. 7 is a graph obtained by combining the 4T operation section and the 3T operation section shown in FIG. 6.

FIG. 7 is a graph showing the expanded dynamic range of the pixel array according to one embodiment. A line 24 shown in the graph of FIG. 7 is obtained by combining the line 21 of the 4T operation and the line 22 of the 3T operation shown in FIG. 6.

As shown in FIG. 7, the signal represents the linear characteristic in the first and second sections, and represents the log characteristic converged to the asymptotic line 23 in the third section. It can be understood from FIG. 7 that the dynamic range is remarkably expanded as compared with that of the related art.

The signal level shown in FIG. 7 may be obtained through the single exposure, other than the dual exposure, so the operational speed may be faster than that of the technology realizing the WDR through the multiple exposure. Thus, the WDR pixel can easily realize the high speed frame rate under the higher resolution.

In addition, since the same storage region, that is, the same floating diffusion node FD is used when reading the signal level of the overflow signal, the linearity can be constantly maintained when combining the signal having the low intensity of illumination with the signal having the high intensity of illumination. In addition, the 4T pixel operation using the transfer transistor TX is used when reading the signal level of the photodiode PD, the quality of the image having the low intensity of illumination can be ensured.

Figure 8:
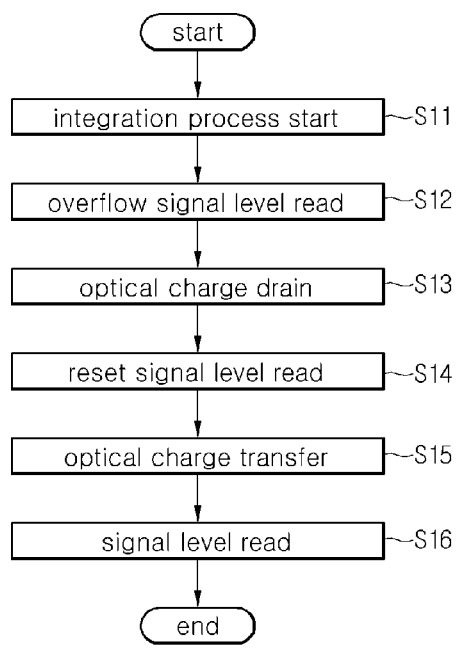
FIG. 8 is a flowchart showing the procedure for operating a pixel array according to the embodiment.

FIG. 8 is a flowchart showing the procedure for operating a pixel array according to the embodiment.

In step S11, the transfer transistor TX and the reset transistor RX are turned on to drain all charges of the floating diffusion node FD and the photodiode PD and then the transfer transistor TX and the reset transistor RX are turned off to start the integration process.

In step S12, the signal level of the overflow charges of the photo-electro conversion unit is read.

In step S13, the reset transistor RX is turned on to drain the charges stored in the storage region.

In step S14, the reset signal level of the storage region is read.

In step S15, the transfer transistor TX is turned on to transfer the charges stored in the photo-electro conversion unit to the storage region.

In step S16, the signal level of the charges transferred to the storage region is read.

After the process for reading the signal level has been completed, the difference between the overflow signal level and the reset signal level becomes the actual overflow signal level and the difference between the reset signal level and the PD signal level becomes the actual PD signal level.

Figure 9:
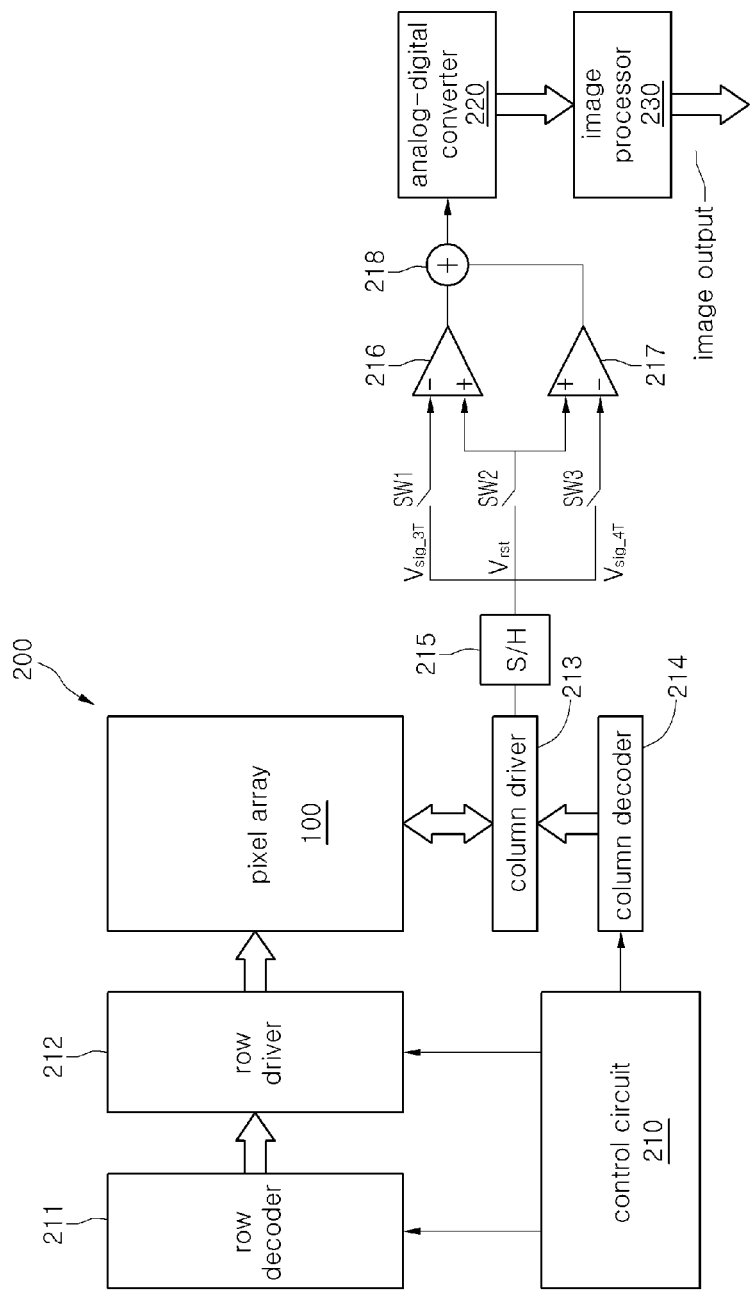
FIG. 9 is a block view showing the structure of an imaging apparatus according to one embodiment.

The method for operating the pixel according to the embodiment may be employed in the pixel array 100 of an imaging apparatus 200 as shown in FIG. 9. The pixel array 100 includes a plurality of pixels, which are configured and operated according to at least one of the embodiments described above. The pixels are arranged in the form of a matrix including columns and rows. A signal processing circuit is connected to the pixel array 100 and a part of the signal processing circuit is formed on a substrate. The pixel in each row of the pixel array 100 is turned on at the same time by the row selection line and selectively output by each column selection line. A plurality of row lines and column lines are provided in the pixel array 100. The row lines are selectively activated by the row driver 212 according to a row address decoder 211. Thus, the row and column addresses are provided for each pixel.

The CMOS imaging apparatus 200 is operated by a control circuit 210, which controls address decoders 211 and 214 in order to select proper row and column lines to apply the control voltage to the transfer and reset transistor. In addition, the control circuit 210 controls row and column driver circuits 212 and 213 to apply the driving voltage to the drive transistor of selected row and column lines. A pixel column signal including an overflow level signal Vsig_3T, a pixel reset signal Vrst, and a pixel image signal Vsig_4T is read by a sample/hold circuit 215.

The actual overflow level signal and the actual pixel image signal are calculated through differential amplifiers 216 and 217 based on the signal read by the sample/hold circuit 215. In detail, when the overflow signal level is read, a switch SW1 is turned on, so that the overflow level signal Vsig_3T is output. In addition, when the reset signal level is read, a switch SW2 is turned on, so that the reset level signal Vrst is output. Further, when the signal level is read, a switch SW3 is turned on, so that the signal level Vsig_4T is output. The first differential amplifier 216 calculates the actual overflow signal level Vrst-Vsig_3T and the second differential amplifier 217 calculates the actual signal level Vrst-Vsig_4T based on the output signals. The calculated actual signals are combined by a summer 218 and then output. The signals combined by the summer 218 represent the output shown in the graph of FIG. 7.

The signals output through the summer 216 are digitalized through an analog-digital converter 220. The analog-digital converter 220 supplies digital pixel signals to an image processor 230 that forms and outputs digital images.

Any reference in this specification to one embodiment, an embodiment, example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. An imaging apparatus comprising:
a photo-electro conversion unit on a substrate;
a transfer switching unit on the substrate at one side of the photo-electro conversion unit;
a storage region on the substrate at one side of the transfer switching unit;
a plurality of pixels including a reset switching unit on the substrate at one side of the storage region; and
a control circuit reading a signal level and a reset signal level and applying a signal to the transfer switching unit and the reset switching unit,
wherein the control circuit reads an overflow signal level transferred to the storage region from the photo-electro conversion unit,
wherein the control circuit applies the signal to the transfer switching unit and the reset switching unit so that the reset switching unit is turned off after the transfer switching unit is turned off during a flush step,
wherein overflow charges generated from the photo-electro conversion unit are not discarded, but the overflow signal level is read,
wherein the signal level is obtained through a single exposure,
wherein the imaging apparatus has an output signal as a function of a light intensity of a pixel array, and
wherein the output signal has a first section, in which a linear signal level is detected until it reaches a maximum capacity of the photo-electro conversion unit, and second and third sections, in which the signal level represents a linear characteristic in an early stage and then represents a log characteristic converged to an asymptotic line after the reset switching unit has been turned on.

2. The imaging apparatus of claim 1, wherein the control circuit omits the reading of the overflow signal level if an overflow charge is not generated in the photo-electro conversion unit.

3. The imaging apparatus of claim 2, wherein the control circuit forms a first signal level based on the overflow signal level and the reset signal level, forms a second signal level based on the reset signal level and the signal level of the storage region, and outputs the first and second signal levels.

4. The imaging apparatus of claim 1, wherein the control circuit applies a reset signal to the reset switching unit to drain optical charges stored in the storage region, reads the reset signal level.

5. The imaging apparatus of claim 4, wherein the control circuit turns on the transfer switching unit to transfer the stored optical charges from the photo-electro conversion unit to the storage region, and reads a signal level of the optical charges transferred to the storage region.

6. The imaging apparatus of claim 5, wherein the control circuit transfers the stored optical charges from the photo-electro conversion unit to the same storage region.

7. The imaging apparatus of claim 1, wherein the control circuit reads each of the overflow signal level of all optical charges.

8. The imaging apparatus of claim 1, wherein all overflowed optical charges are transferred to the storage region.

9. The imaging apparatus of claim 1, wherein overflow charges generated from the photo-electro conversion unit are not discarded and all of the signal level of the overflow charges are read.

10. The imaging apparatus of claim 1, wherein the same storage region is used when reading the overflow signal level.

11. The imaging apparatus of claim 1, wherein the plurality of pixels further comprises a select switching unit on the substrate at another side of the storage region, wherein the select switching unit is turned on before the reset switching unit is turned on to read the reset signal level.

12. The imaging apparatus of claim 11, wherein the overflow signal level is read without reading a signal level of charges accumulated in the photo-electro conversion unit.

13. The imaging apparatus of claim 1, wherein the first section is subject to the low intensity of illumination or the normal intensity of illumination where the overflow charges are not generated from the photo-electro conversion unit, such that a general 4Transistors operation is performed.

14. The imaging apparatus of claim 1, wherein a 3Transistors operation is performed in the second and third sections, and
wherein the third section starts after the overflow charges have been fully filled in the storage region and represents a sub-threshold behavior before the reset switching unit is turned on.

15. The imaging apparatus of claim 14, wherein the output signal of the third section is slowly increased in the vicinity of the turn-on of the reset switching unit and represents the log characteristic converged to the asymptotic line.

* * * * *